United States Patent
Paul et al.

(10) Patent No.: US 11,409,342 B2
(45) Date of Patent: Aug. 9, 2022

(54) MODULAR PC COOLING PUMP

(71) Applicant: Corsair Memory, Inc., Fremont, CA (US)

(72) Inventors: Andy Paul, Fremont, CA (US); Janusz Labedz, Fremont, CA (US); Guillermo Andres, Fremont, CA (US); Dean Depay, Fremont, CA (US); Eamonn Clerkin, Fremont, CA (US); George Joseph Lampard, Fremont, CA (US)

(73) Assignee: Corsair Memory, Inc., Fremont, CA (US)

( * ) Notice: Subject to any disclaimer, the term of this patent is extended or adjusted under 35 U.S.C. 154(b) by 424 days.

(21) Appl. No.: 16/664,257

(22) Filed: Oct. 25, 2019

(65) Prior Publication Data

US 2020/0133356 A1 Apr. 30, 2020

Related U.S. Application Data

(60) Provisional application No. 62/752,295, filed on Oct. 29, 2018.

(51) Int. Cl.
*G06F 1/20* (2006.01)
*H05K 7/20* (2006.01)
*F21V 33/00* (2006.01)

(52) U.S. Cl.
CPC .......... *G06F 1/206* (2013.01); *F21V 33/0092* (2013.01); *G06F 1/20* (2013.01); *H05K 7/20172* (2013.01); *H05K 7/20209* (2013.01); *H05K 7/20272* (2013.01); *H05K 7/20281* (2013.01); *G06F 2200/201* (2013.01)

(58) Field of Classification Search
CPC ...... G06F 1/206; G06F 1/20; G06F 2200/201; F21V 33/0092; H05K 7/20172; H05K 7/20209; H05K 7/20272; H05K 7/20281
USPC ................ 361/679.53, 698, 699; 415/60–69
See application file for complete search history.

(56) References Cited

U.S. PATENT DOCUMENTS

| | | | | |
|---|---|---|---|---|
| 5,540,548 A | * | 7/1996 | Eberhardt | F04D 25/166 415/60 |
| 5,546,272 A | * | 8/1996 | Moss | H05K 7/2019 361/679.48 |
| 6,754,076 B2 | * | 6/2004 | Cox | G06F 1/20 174/15.1 |
| 2011/0292595 A1 | * | 12/2011 | El-Essawy | G06F 1/20 361/679.53 |

* cited by examiner

*Primary Examiner* — Hoang M Nguyen
(74) *Attorney, Agent, or Firm* — Carina M. Tan; Corsair Memory, Inc.

(57) ABSTRACT

A modular PC cooling pump for use in a personal computer is disclosed, according to certain embodiments. The modular PC cooling pump comprises a plurality of stackable interchangeable modules, according to certain embodiments.

9 Claims, 14 Drawing Sheets

MODULAR PC COOLING PUMP

CROSS-REFERENCE TO RELATED APPLICATIONS

The present application claims the benefit of U.S. Provisional Patent Application Ser. No. 62/752,295, filed Oct. 29, 2018 and entitled "Modular PC Cooling Pump," which is hereby incorporated by reference in its entirety.

TECHNICAL FIELD

The present invention is directed to a cooling pump for personal computers.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

DESCRIPTION OF EMBODIMENTS

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

Figure 1:
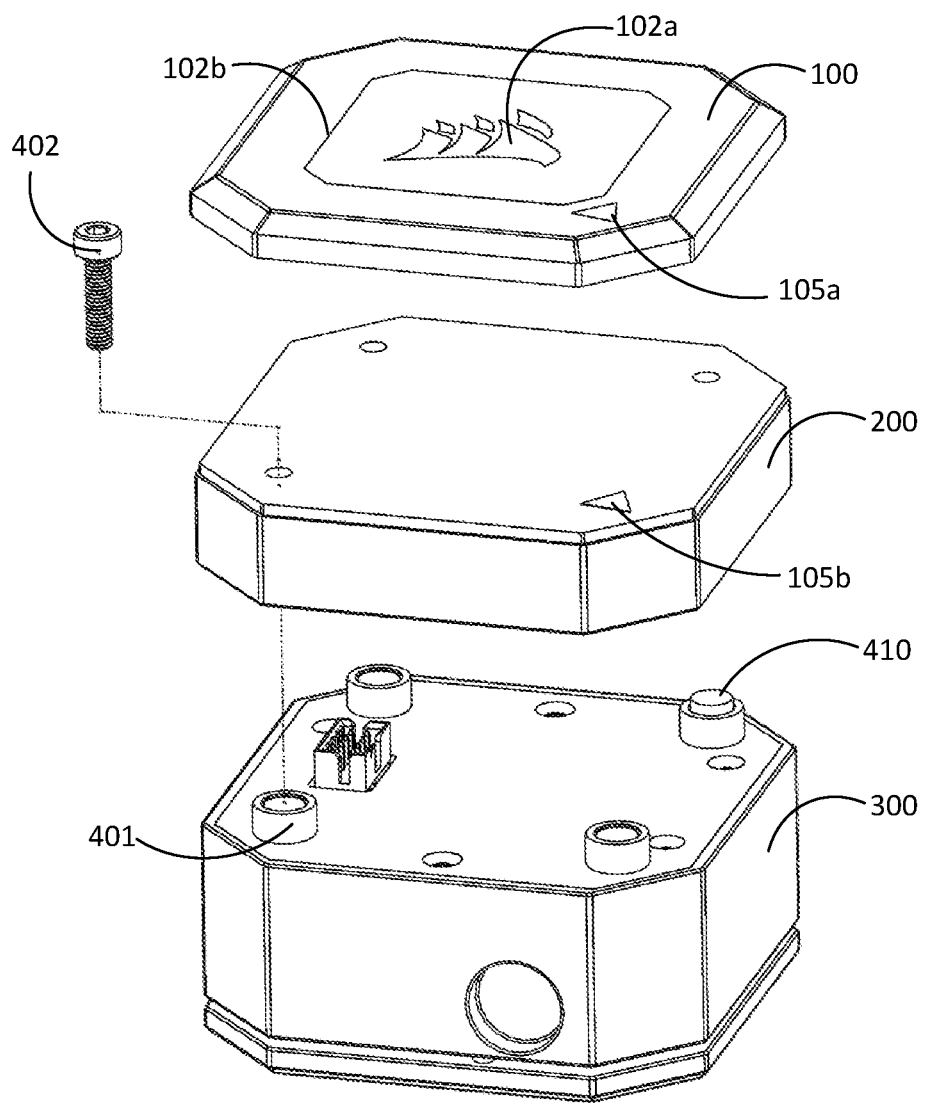
FIG. 1 illustrates a perspective exploded view of a modular pump, according to certain embodiments.

FIG. 1 illustrates a perspective exploded view of a modular pump, according to certain embodiments. FIG. 1 shows cover module 100, functional module 200, and pump module 300, according to certain embodiments.

The cover module 100 may function as a top cover to protect components of the functional module 200, or to prevent accidental access to the functional module 200. According to certain embodiments, cover module 100 may or may not have any decorative functionality.

The cover module 100 may also function as a decorative component. It can be made using opaque materials. Non-limiting examples of such materials include black ABS (Acrylonitrile-Butadiene-Styrene), metals, painted plastics. According to certain embodiments, the ABS can be any suitable color. A logo 102a or other decorative profiles 102b or drawings can be applied or displayed on the cover. A logo 102a or other decorations may be engraved, painted, etched, applied stickers, or projected on the surface. The cover module 100 may include illuminating components, such as lightbulbs, LEDs, OLED displays, electroluminescent or glowing compounds. It may include light diffusers, light pipes, or it may be a light diffuser itself.

Figure 2:
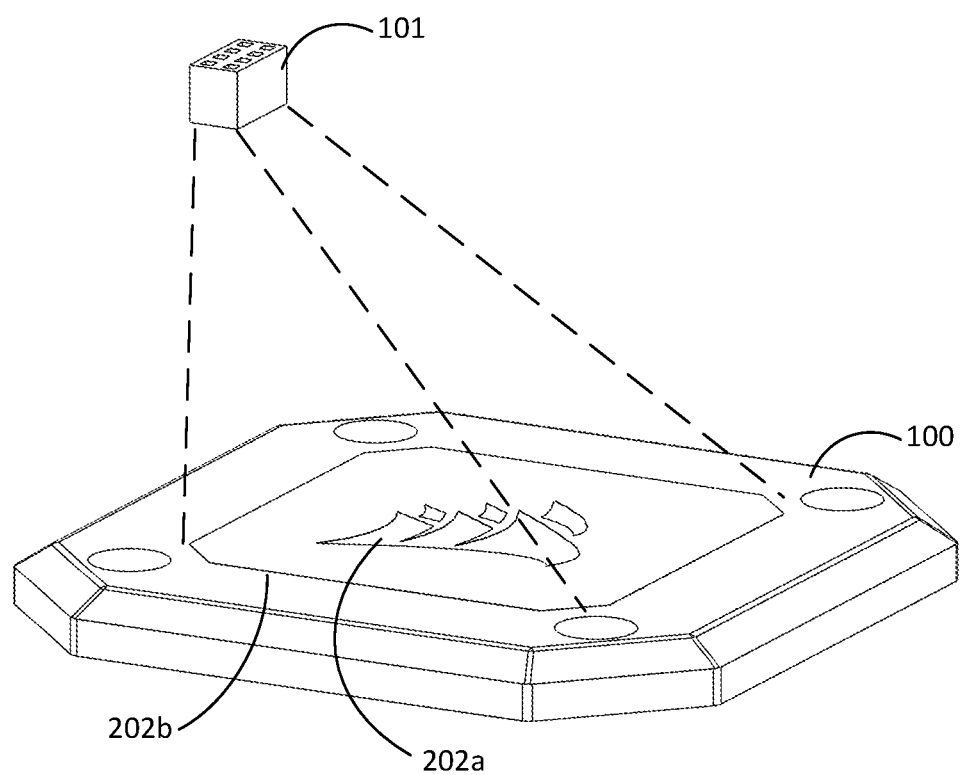
FIG. 2 illustrates logos and/or decorative profiles projected from an external source and reflected from the surface of the cover module of the modular pump, according to certain embodiments.

FIG. 2 illustrates logo 202a and/or decorative profile 202b projected from an external source 101 and reflected from the surface of the cover module 100, according to certain embodiments. The cover module 100 can be made using transparent or translucent materials. Logo 202a and/or decorative profiles 202b can be applied to any surface of the cover module 100. External source 101 can be a simple light source with an engraved or a painted surface that casts light or shadow on the surface of cover module 100. External source 101 can also be a projector that allows the display of animations.

Figure 3:
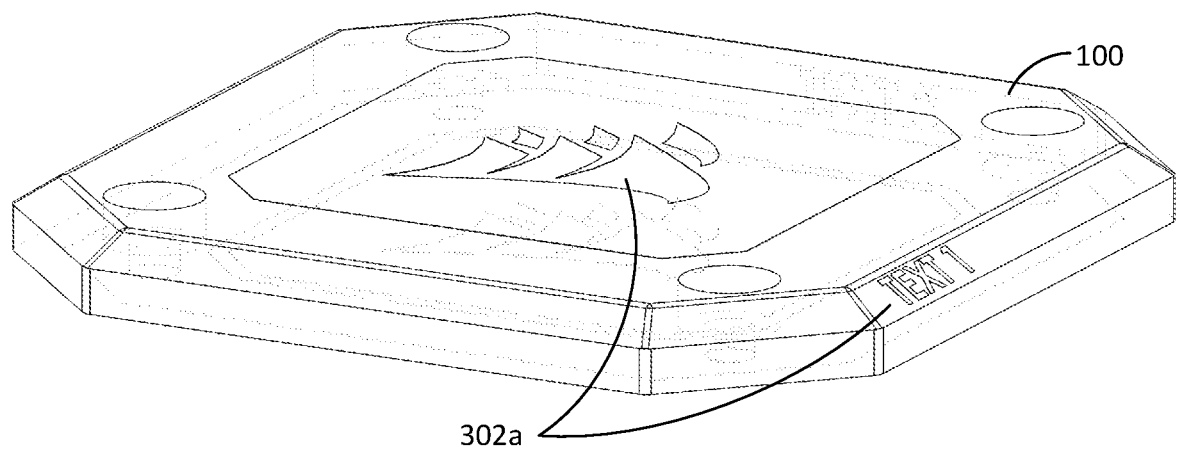
FIG. 3 illustrates examples of logos applied to example surfaces on the cover module, according to certain embodiments.

FIG. 3 illustrates examples of logos 302a applied to example surfaces on cover module 100, according to certain embodiments.

Figure 13:
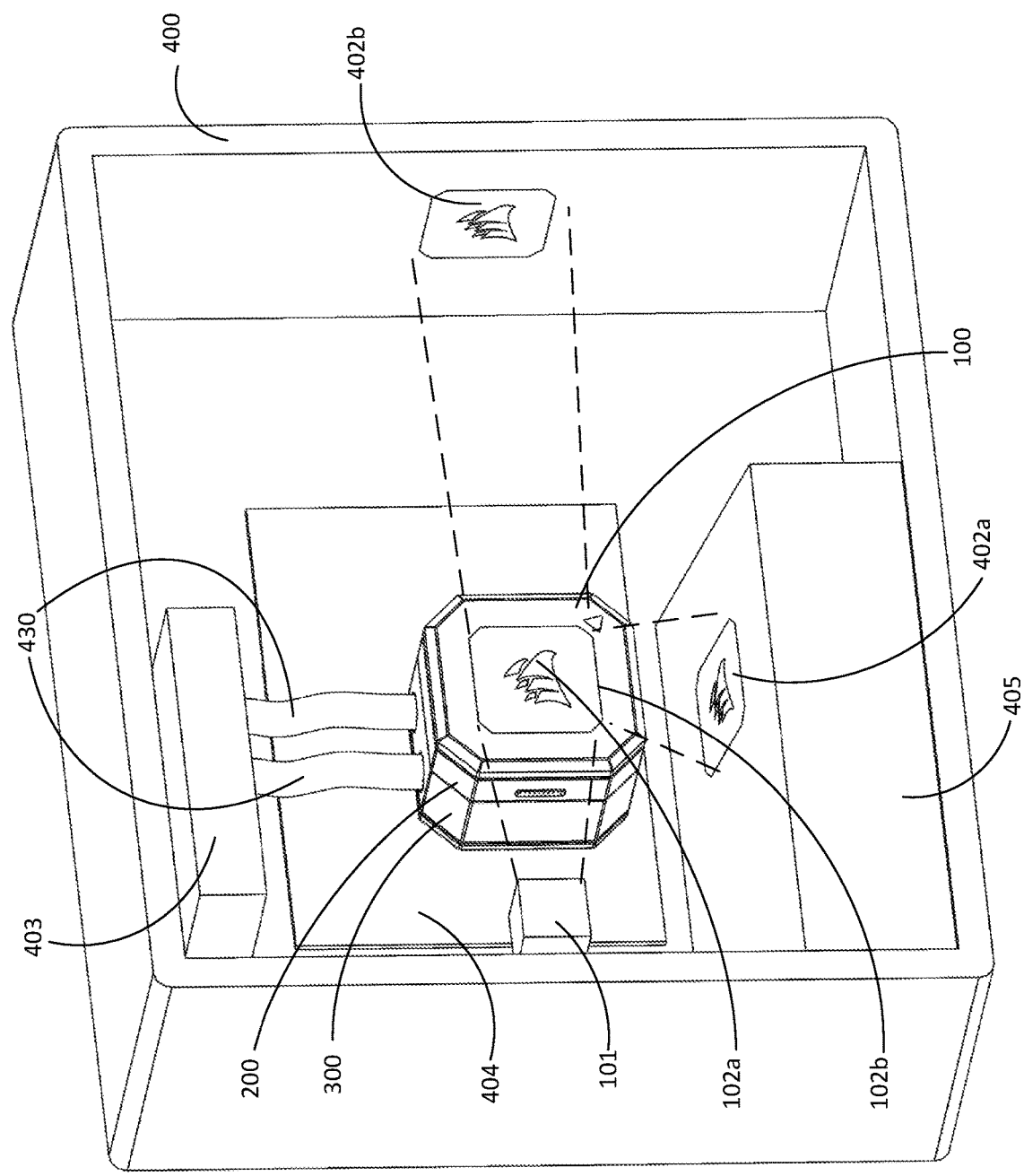
FIG. 13 illustrates a practical application of the system described in FIG. 4, according to certain embodiments.

The cover module 100 can be illuminated or backlit to enhance visibility of a logo 102a/202a/302a (for example, see FIG. 1, FIG. 2, FIG. 3) or decoration profiles 102b/202b/302b (see FIG. 1, FIG. 2, FIG. 3). A logo 102a/202a/302a (for example, see FIG. 1, FIG. 2, FIG. 3) or decorative profiles 102b/202b/302b (for example, see FIG. 1, FIG. 2, FIG. 3) can be made translucent or opaque to allow or block light respectively to passthrough or illuminate an outline. Lighting effects can be projected through the cover module 100 to distort, add colors, and/or add visual effects. FIG. 13 shows light or an animation from external source 101 projected through the cover module 100 to display logos 102a/202a/302a and/or decorative profiles 102b/202b/302b on surfaces of chassis 400, or a sheet metal shroud 405.

Figure 4:
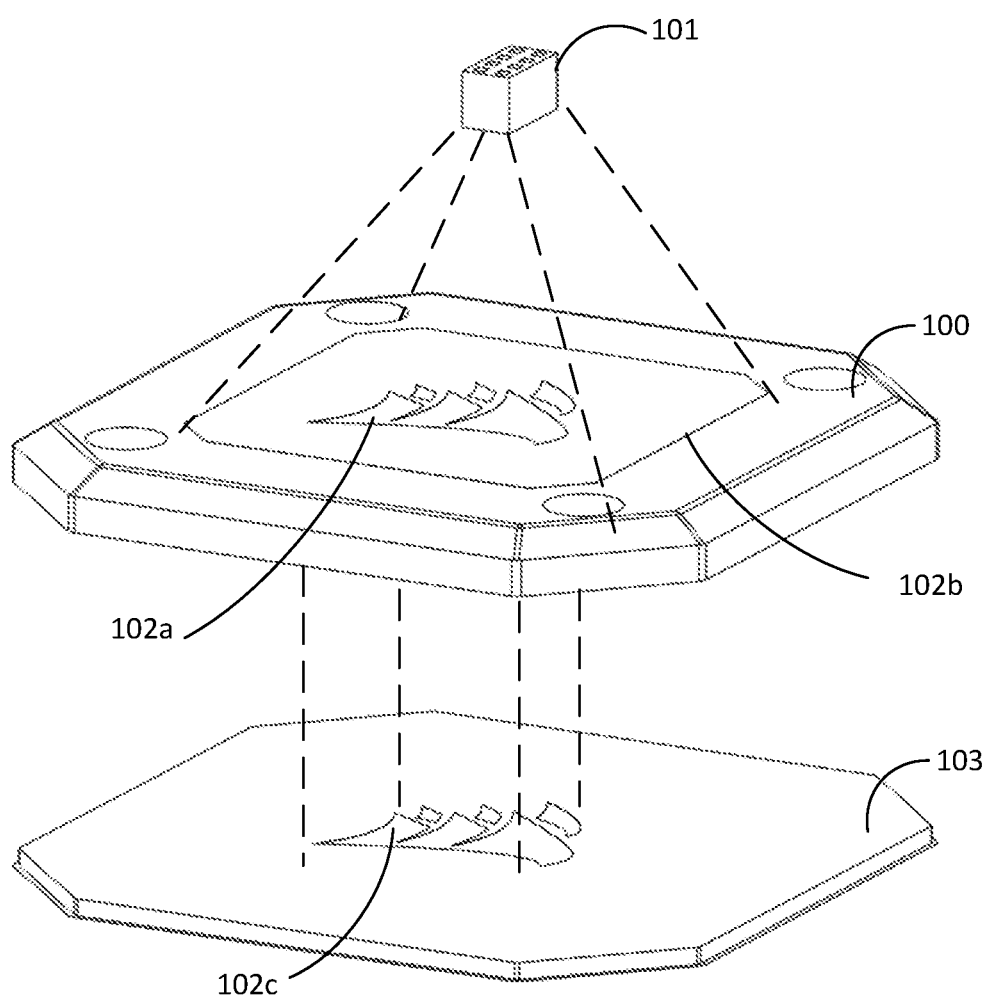
FIG. 4 illustrates an example of a system that projects light from a source onto a logo and/or decorative profile, according to certain embodiments.

FIG. 4 illustrates an example of a system that projects light from a source 101 onto logo 102a and decorative profile 102b, which are part of cover module 100, and casts image 102c on surface 103, according to certain embodiments. Cover module 100 may be made out of translucent materials to create color effects, for example. Cover module 100 may be shaped as a lens to create distorted, magnified or focused lighting effects, for example. Cover module 100 may be made out of opaque material with drilled small diameter holes to create dispersed or diffracted lighting effects, for example. Surface 103 may be a surface of the functional module 200, or the pump module 300, for example.

FIG. 13 illustrates a practical application of a system described in FIG. 4, according to certain embodiments. FIG. 13 shows a light source 101 that uses cover module 100 to project images 402a on top of a sheet metal shroud 405, and image 402b on a surface of an enclosure 400. A non-limiting example of enclosure 400 is a computer chassis. Images can be projected through cover module 100 and displayed on any surface of the enclosure 400. Images can also be displayed on any other surface, such as radiator 403, or motherboard 404 in the computer chassis.

The cover module 100 can be stacked to provide visual effects. Non-limiting examples of external source 101 are LEDs, fluorescent displays, projector modules. External source 101 is external to the modular pump, according to certain embodiments.

Figure 5:
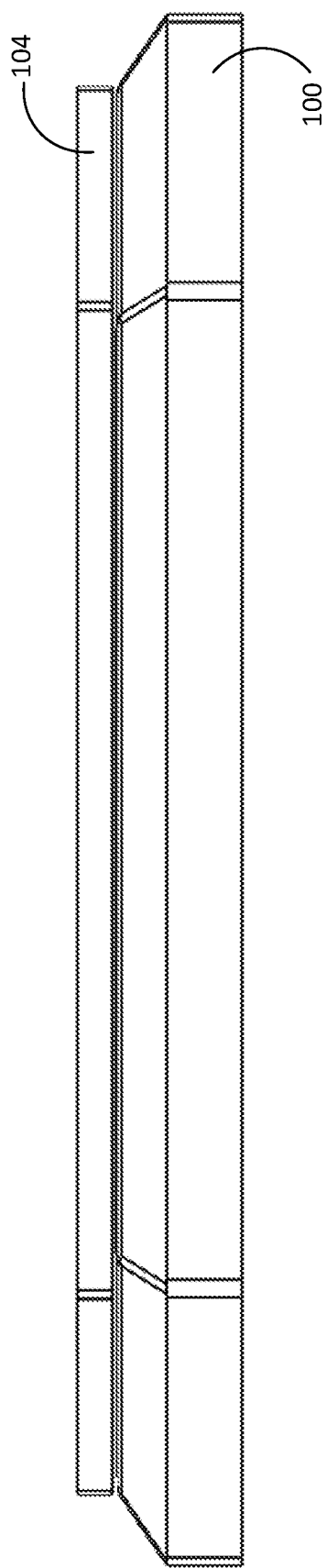
FIG. 5 illustrates a stacked cover module with protective layer, according to certain embodiments.

FIG. 5 illustrates a stacked cover module 100 with protective layer 104, according to certain embodiments. The cover module 100 can be stacked using protective surfaces. For example, a protective layer 104 may be placed on top of the cover module 100, or cover module 100 can be coated by a protective layer 104 that may be scratch resistant or is a chemical resistant surface.

The cover module 100 can be made asymmetrical or as shown on FIG. 1, the cover module 100 can include markings or indicators 105a, 105b, to allow alignment to other components of the subassembly (e.g., alignment with functional module 200), or ease of orientation in respect to external assemblies. According to certain embodiments, the cover module 100 may be symmetrical to allow free/arbitrary orientation or unobstructed affixing of the subassembly, and at the same time allow to be rotated to display logo or drawings in a desired orientation.

Figure 6A:
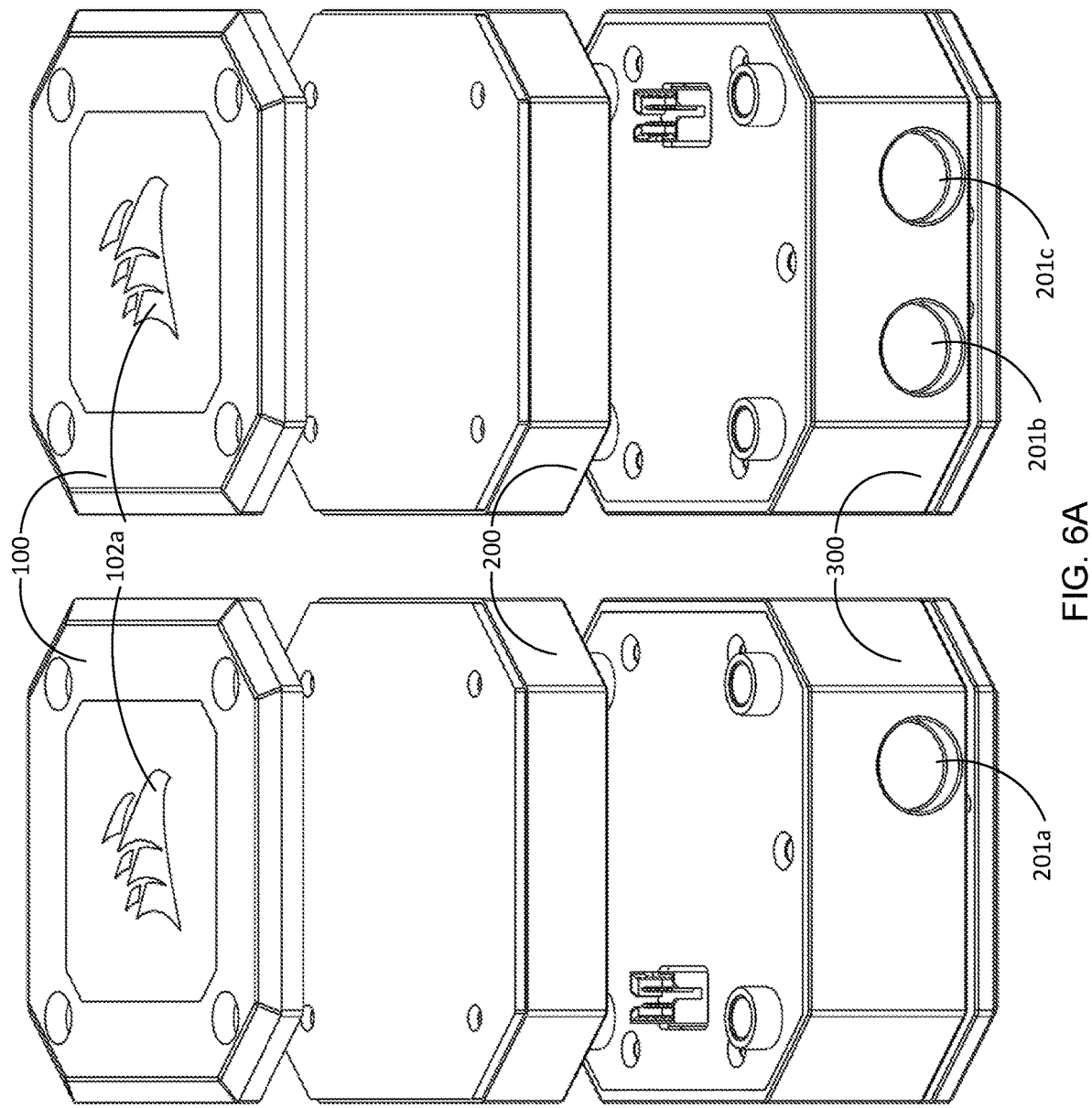
FIG. 6A and FIG. 6B illustrate a pump module in different orientations, according to certain embodiments.
Figure 6B:
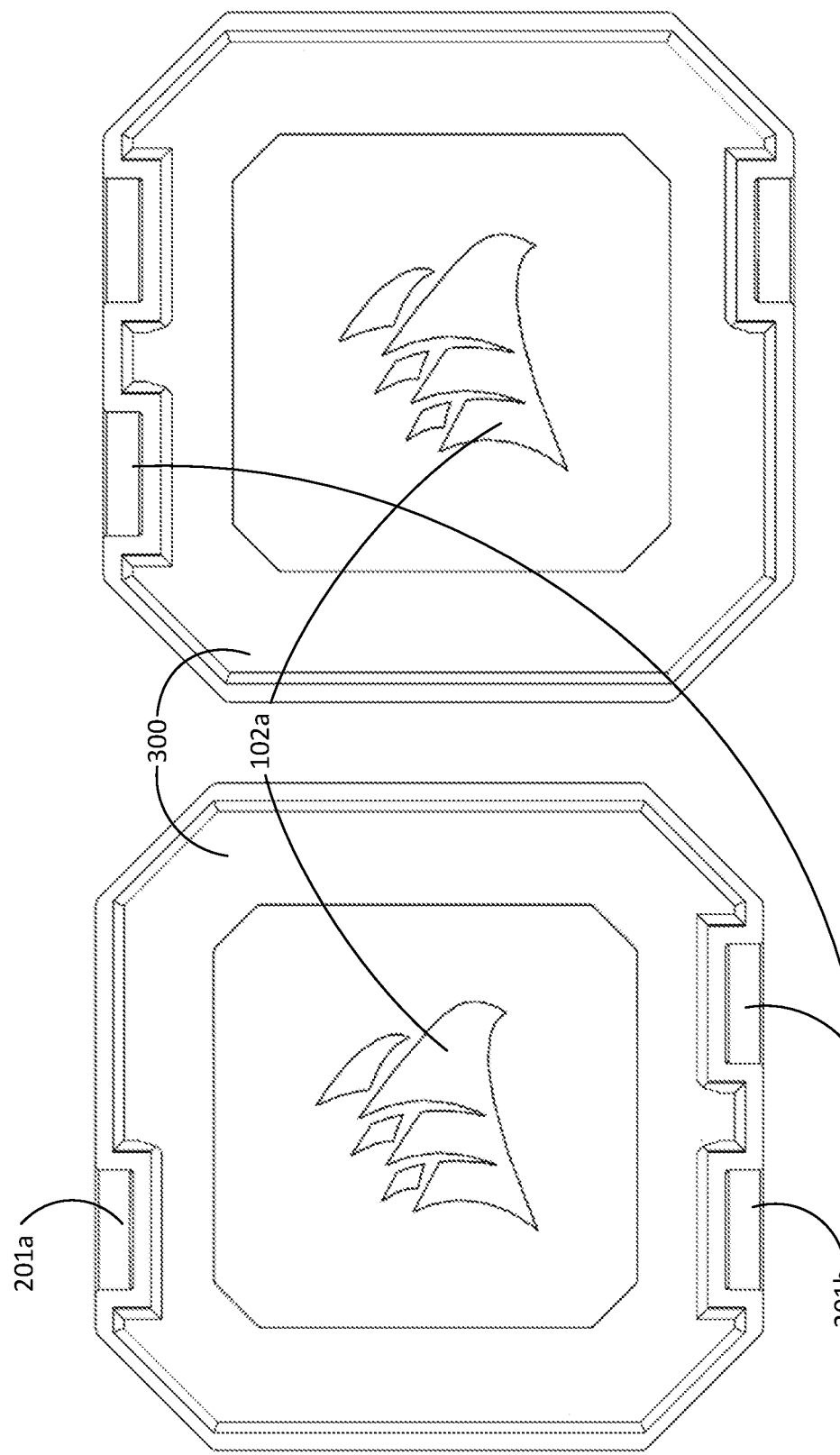

FIGS. 6A and 6B illustrates a pump module 300 in different orientations to allow unobstructed access to pump port 201a, pump port 201b, or pump port 201c while cover module 100 remains affixed in a desired upright orientation, according to certain embodiments (FIG. 6B is a top view of the modular pump module 300). For example, pump port 201a and pump port 201b may be located on opposite sides of the pump module 300. The pump ports 201a/201b/201c are functional features of the pump module 300. According to certain embodiments, one of the ports is dedicated as an input port, while another port functions as an output port. Additional ports may be used to fill the pump module 300 and radiator 403 (for example, see FIG. 12 and FIG. 13, herein) with fluid, according to certain embodiments. FIG. 13 shows fluid recirculates through the pump module 300 and radiator 403 through hoses 430. According to certain embodiments, the orientation of the pump module 300 can have a significant performance impact and thus, may not be arbitrarily positioned in a system. In certain embodiments, the orientation of the pump module 300 may be dictated by space restrictions or positioning of the radiator 403. The modular design as disclosed herein allows the rotation of the pump module 300 to orient it in an optimal position, while the cover module 100 and corresponding logo 102a can be oriented at a desirable viewing angle in an assembly.

Figure 7:
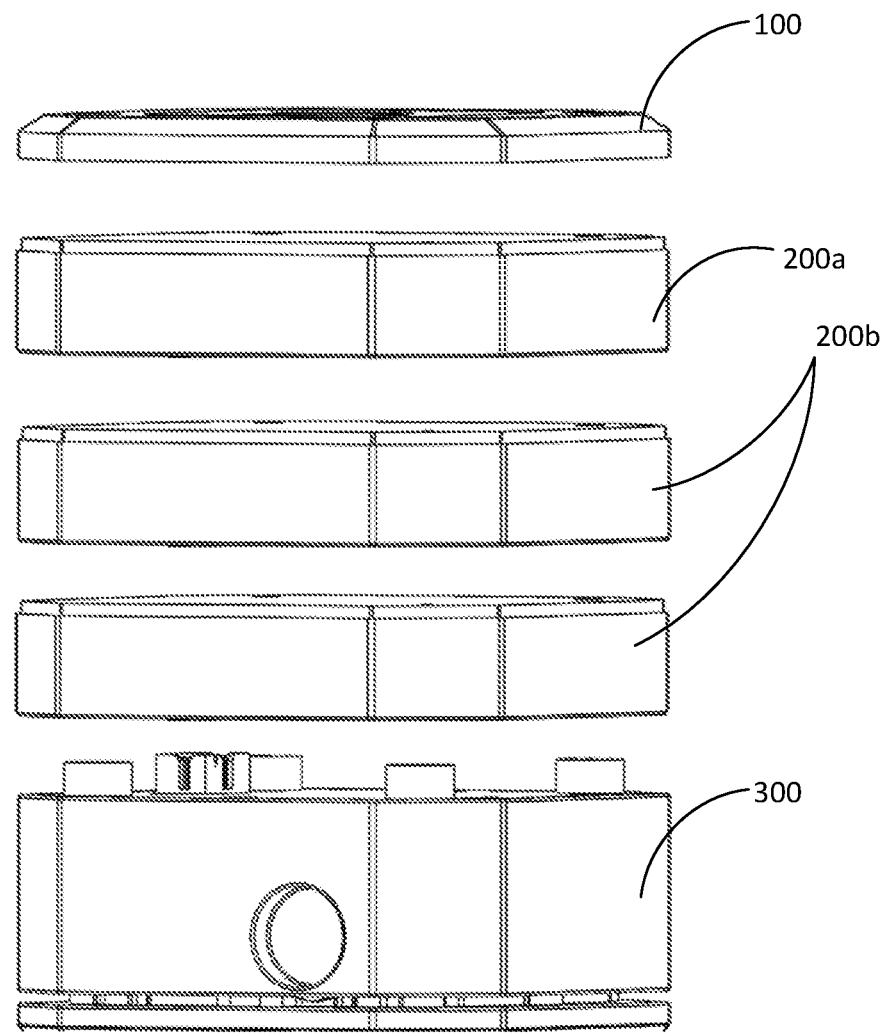
FIG. 7 illustrates an example of a modular stack of a modular pump, according to certain embodiments.

The functional module 200 can be stackable. FIG. 7 illustrates that one or more functional modules 200, with the same or different functionality, may be assembled to augment the functionality of the system. FIG. 7 illustrates an example of a modular stack of a modular pump, according to certain embodiments. Two identical functional modules 200b (e.g., temperature sensors), and one functional module 200a (e.g., source of light to illuminate cover module 100), are stacked together with cover module 100, and pump module 300.

Figure 8:
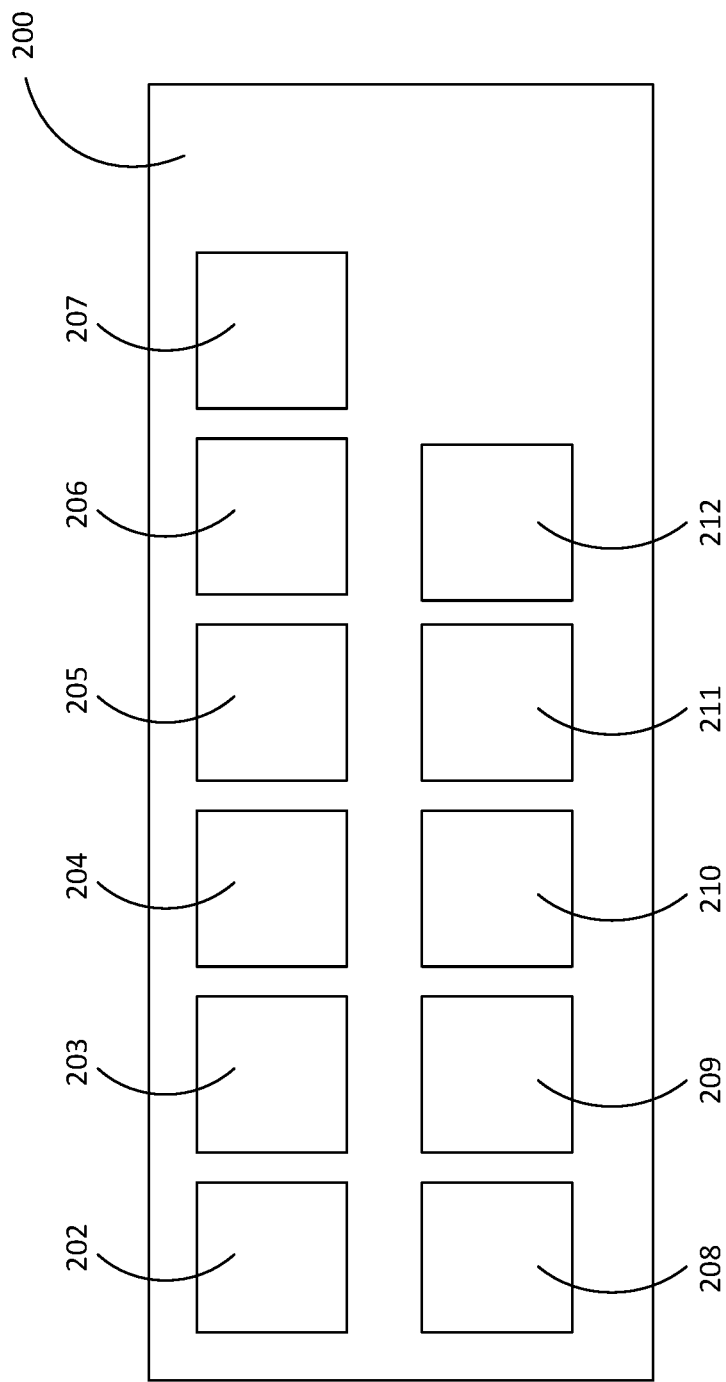
FIG. 8 is a logical block diagram of functional a module that provides monitoring of the environment, according to certain embodiments.

Sensors may function as feedback of the environment to control the system, or to inform users about the environment or performance of the system. FIG. 8 is a logical block diagram of a functional module 200 that provides monitoring of the environment, according to certain embodiments. Functional module 200 may include one or more similar monitoring sensors, or a combination of different sensors. For example, FIG. 8 shows that functional module 200 may include at least a subset of the following sensors: temperature sensor 202, sound level sensor 203, pressure sensor 204, humidity sensor 205, air flow sensor 206, audio microphones sensor 207, light sensors 208, piezo devices 209, accelerometers 210, particle sensor 211, and gas sensors 212. Sensors may function as feedback of the environment to control the system, or to inform users about the environment or performance of the system. Examples of the use of sensors in a personal computer (PC) system may include temperature sensors 202 used for monitoring ambient temperature or temperature of coolant flowing through pump module 300. Sound level 203 may be used to detect abnormal operation of pump module 300 which may generate elevated noise when air is trapped in the path of the pump module 300. Pressure sensors 204 may be used to monitor pump module 300 internal pressure to record performance or detect system faults. Humidity sensors 205 may be used to detect coolant spillage. Air flow sensor 206 may be used to monitor performance of supplemental cooling system such as a fan 222 (for example, see FIG. 10, herein). Audio microphones sensor 207 may be used as part of feedback for sound cancelation module 224 (for example, see FIG. 11, herein). Light sensors 208 may be used to control illumination of cover module 100. Piezo devices 209, or accelerometers 210 can be used to detect abnormal operation of pump module 300 through detection of vibrations. Particle sensors 211 may be used to detect dust levels and provide feedback to the functional module 200 that may serve as a dust collector. Gas sensors 212 may provide feedback about gas concentration and provide alert in case of abnormal outgassing of coolant from the pump module 300 or other parts of the system.

Functional module 200 may include pump control circuitry, including pump speed control, fan speed control, remote pump and fan controls. Control module can make the pump assembly self-governed and can control external pump and fans. The pump assembly can also be controlled by external devices and function just as a very basic system with no self-governed capabilities.

Figure 9:
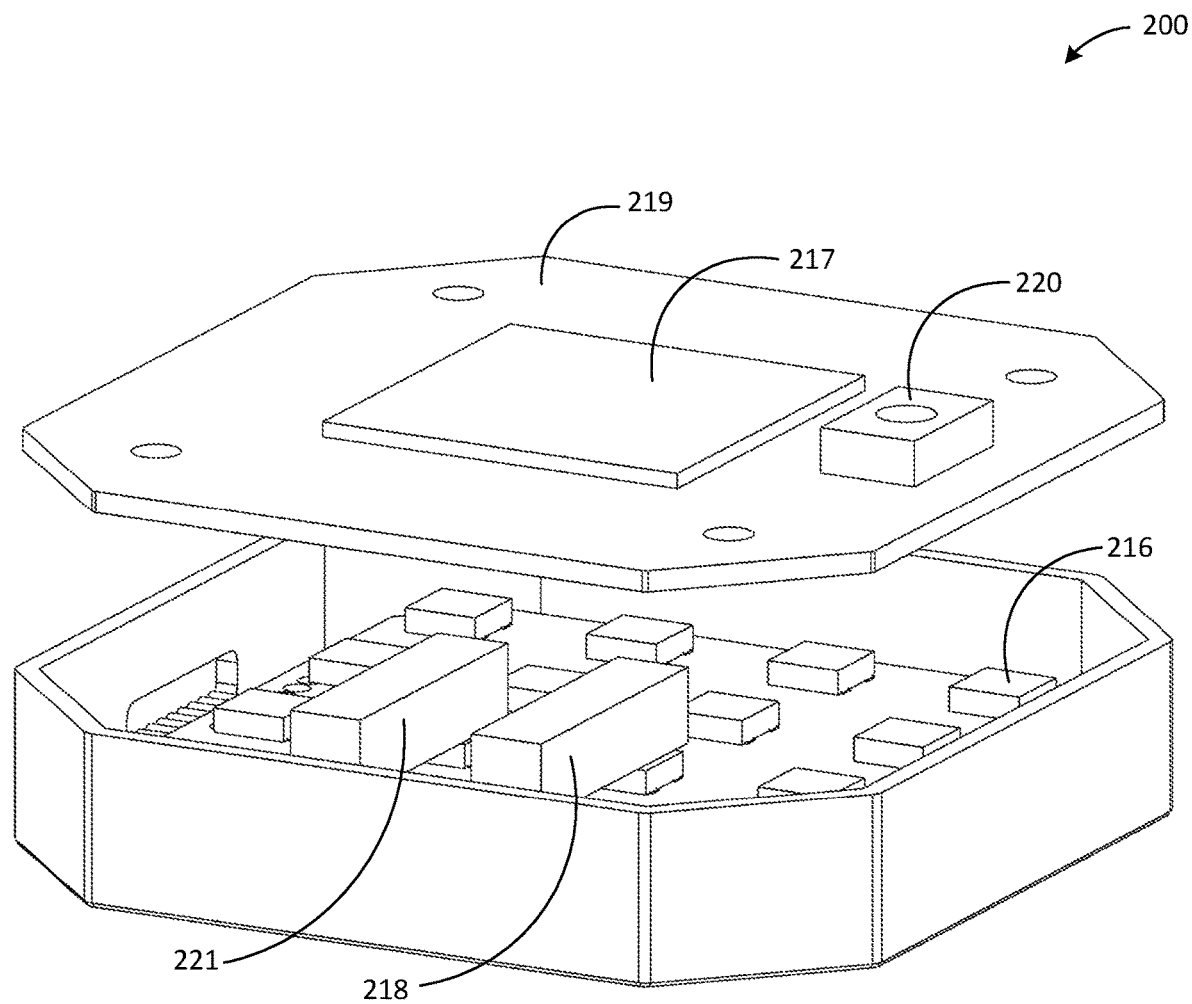
FIG. 9 illustrates a functional module that may include lighting control, according to certain embodiments.

FIG. 9 illustrates a functional module 200 that may include lighting control, according to certain embodiments. It can contain LEDs 216, graphical displays 217, light pipes 218, and light diffusers 219. Functional module 200 can illuminate itself or other modular subassemblies. For example, functional module 200 may illuminate the cover module 100 as well as other components that may be part of a system shown in FIG. 13. Components of a system may include motherboard 404, radiator 403, enclosure 400. It may include graphical displays 217 (e.g., OLED, LCD) and a projection system for alerts, messages, email or text announcements. Functional module 200 can provide lighting and visual cues, status of a system or components, fan and/or pump speeds, and/or information gathered from sensors.

FIG. 9 also shows that the functional module 200 may include camera modules 220 used for lighting recognition and ambient lighting cohesion and/or lighting effects synchronization. Camera modules 220 can be used for facial recognition to start/boot or access a system. Camera modules 220 can be used to provide information of users accessing a system, allowed users or alerts of security breach.

Functional module 200 may include a wireless transceiver 221 used for remote PC control, start and reset, for example. Wireless transceiver 221 may be used to receive or transmit information from other modules or external devices, phones, tablets, etc.

Functional module 200 may include safety or security implementations, preventing unintended users from accessing a system. It can use information gathered from built-in sensors or other modules to inform remote users of ambient conditions, temperature, pressure, humidity, light or sound levels.

Figure 10:
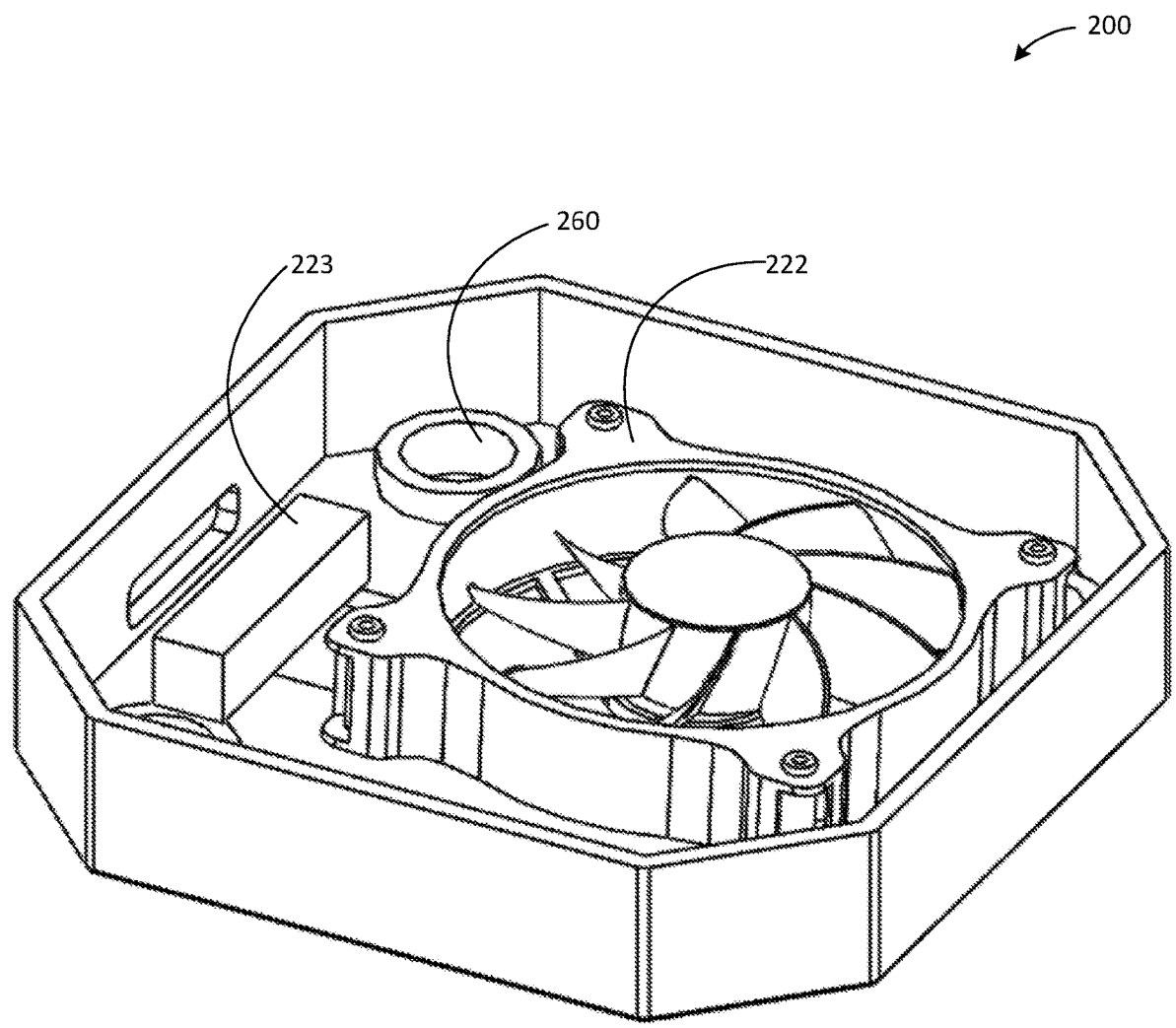
FIG. 10 illustrates a functional module that includes a supplemental fan system, according to certain embodiments.

FIG. 10 illustrates a functional module 200 that includes a supplemental fan system 222, according to certain embodiments. It can be used to provide additional cooling for pump module 300. It can provide cooling or heating for thermal stability or reliability of other modules.

FIG. 10 also shows a functional module 200 that includes an active or passive dust collection, according to certain embodiments. It may include a filter 223 and a supplemental system fan 222, and/or electrostatic or ionizing particle trap 260. In place of filter 223 it may include a passive electrostatically charged material that can trap particles.

Figure 11:
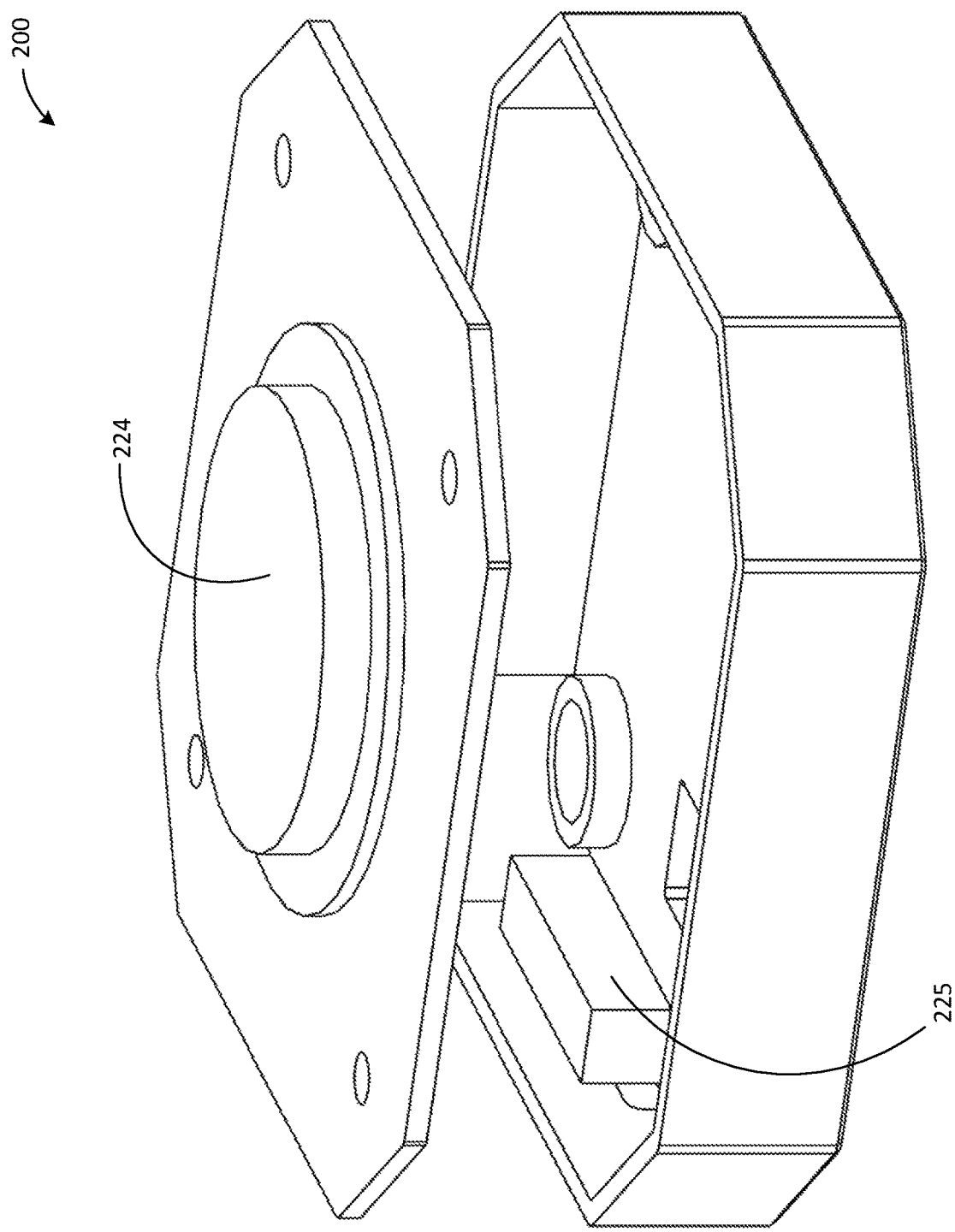
FIG. 11 illustrates a functional module that includes noise canceling device, according to certain embodiments.

FIG. 11 illustrates a functional module 200 that includes noise canceling device 224, according to certain embodiments. A microphone 225 used in a feedback loop may be feed to a signal processor and appropriate wave can be generated using a piezo or a speaker to cancel out undesired sound or wavelengths. The module can also be used to provide audible cues or system information.

Figure 12:
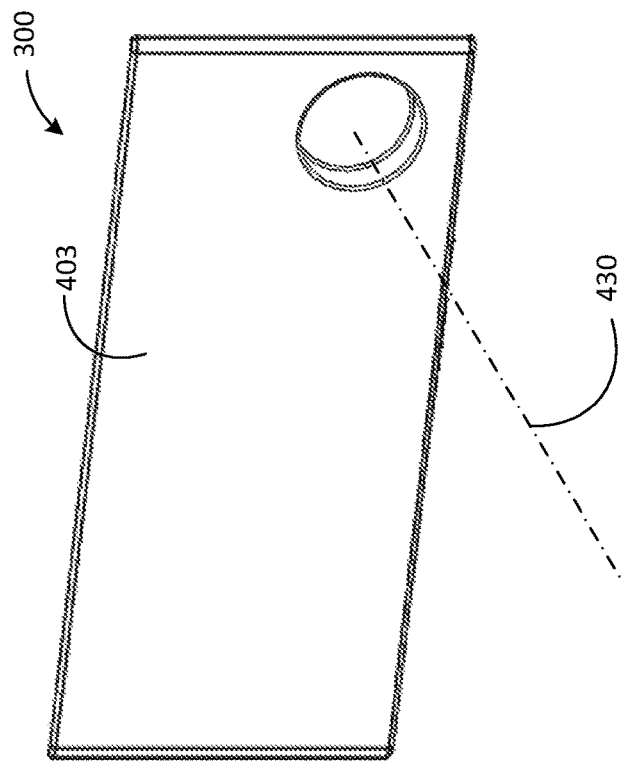
FIG. 12 illustrates the pump module that includes sensors and controller board, according to certain embodiments.
Figure 12:
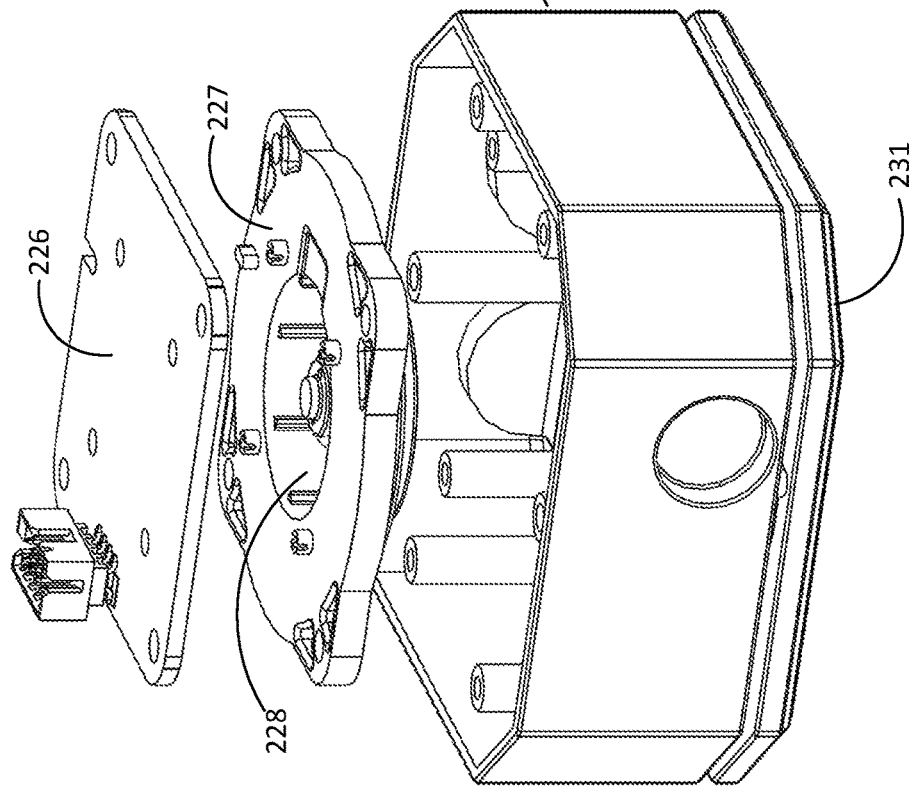

FIG. 12 illustrates the pump module 300 that includes sensors and controller board 226, according to certain embodiments. Sensors and controller board 226 may be used either to govern the pump module 300 or to communicate with external controllers.

FIG. 12 shows the pump module 300 that includes an impeller 227 and motor 228, and contains all necessary components to provide liquid flow and cooling or heating capabilities, according to certain embodiments. The pump module 300 may connect to an external radiator 403 via hoses 430 to regulate fluid temperature. The pump module 300 may connect to another functional module 200 in the system that may serve as a radiator or liquid reservoir, according to certain embodiments.

The pump module 300 may be a passive fluid passage connected to a cold plate 231, according to certain embodiments. The fluid may flow via natural convection or with the use of a pump, according to certain embodiments. The pump may be mounted externally or the functional module 200 may function as a fluid pump, according to certain embodiments. Two or more pump modules 300 may be stacked to satisfy high pressure or flow requirements if such requirements cannot be achieved using only one pump module 300 or to supplement an external pump, according to certain embodiments.

Connections between the modules or external controllers or devices can be made using mechanical connectors, such as pogo pins, headers, compression or spring connectors, captive wires or wired connectors, optical coupling, according to certain embodiments. Communication may also be accomplished using wireless/RF approach. Stacked modules may make use of some or all of the connectors or may serve as a passthrough interface between other modules or external controllers or devices, according to certain embodiments.

Modules can be stacked and affixed using methods that require tools or toolless methods, according to certain embodiments. Modules affixed using toolless methods may be fastened using additional methods that require tools in order to provide additional security or protection from unintentional disassembly. FIG. 1 shows examples of methods of assembly which may include any combination of magnets 410, press-fit features 401, screws 402, etc. Modules that are intended to be field upgradable may be affixed using toolless methods, according to certain embodiments.

A modular approach enables users to update modules or add system capabilities. Updated modules, i.e., updated pump module 300 may be used with earlier versions of top covers, pump control, or functional modules. A modular approach also allows tool savings during the manufacturing process. Changes made to modules may not affect functionality of other modules, for example. By using a modular approach, modules manufactured by different suppliers with different manufacturing expertise can be assembled to provide extended functionalities. For example, pump and impeller manufacturers may not have optimal solutions for a radiator interface, or they may not have adequate lighting solutions. Modular systems can be assembled using subcomponents from different suppliers or different revisions/versions to achieve desired performance and desired functionalities/features.

According to certain embodiments, a modular PC cooling pump comprises a plurality of modules including a CPU or GPU water cooling block, an illumination/display module with a controller assembly and cover module.

According to certain embodiments, each of at least a subset of the plurality of modules may be interchangeable. According to certain other embodiments, illumination/display module and the cover module may be constructed as a single module. According to certain embodiments, additional control or lighting modules or different types of functional modules modules may be stacked as part of the modular PC cooling pump for added functionality.

According to certain embodiments, having the cover module separate from the illumination/display module allows the cover module free to rotate in order to have the logo in an orientation that is independent of the orientation of the CPU or GPU cooling block assembly.

The modular approach allows the user to have interchangeable top caps (cover modules) with different designs or features. For example, in one instance the cover module may be a low cost black cover with a printed logo. In another instance the other, the cover module may include RGB LED's, and in yet another instance the cover module may include an OLED displaying functional information. The afore mentioned types of cover modules can be used interchangeably by connecting to the same pump-cold plate module. Such a modular approach of the constructing the PC cooling pump offers a user a convenient and economical opportunity to upgrade the PC cooling pump without incurring the cost of changing out the entire PC cooling pump.

Further, such a modular approach of constructing the PC cooling allows for the technological enhancements of the cold plate and pump to advance at a separate pace from the refreshes in industrial design (ID) of the PC cooling pump.

Thus, improvements in the cold plate pump can be rolled in immediately in the field independent of ID developments. Similarly, a run of the mill cold plate/pump module can customize with different ID tops for different customers at different price points. Thus, more functionality options and flexibility can be offered to the end user with less inventory carrying costs. ID refreshes can be independent of the pump development. By using a modular approach, a user can upgrade his/her PC cooling pump without full dis-assembly of water cooling block.

According to certain embodiments, there would be a connection between the cooling pump assembly and the interchangeable top cap (cover module) where information to drive the pump speed, tack signal back, thermistor temperature reading of coolant or cold plate and a cooling pump assembly ID is transmitted between the modules. The bottom cooling pump assembly can be provided by different suppliers. The electrical connection between the modules can be done in many different ways including pin mechanical fit connectors, spring contact connectors, etc. The mechanical attachment can also be done in many different ways including magnets, snaps, screws, and connectors.

We claim:

1. A modular PC cooling pump comprising:
   a plurality of stackable modules, the plurality of stackable modules including: one or more cover modules, one or more functional modules, and one or more pump modules;
   wherein each of the cover modules, the functional modules, and the pump modules communicate by means of electrical connection, wireless, or RF approach; and
   wherein the one or more cover modules, the one or more functional modules and the one or more pump modules are interchangeable with other modules.

2. The modular PC cooling pump of claim 1, wherein the one or more cover modules is any one or more of: an OLED type display cover module, an LED type cover module, an engraved type cover module, a painted type cover module, an etched type cover module, a light diffuser type cover module, and a lens type cover module.

3. The modular PC cooling pump of claim 1, wherein the one or more functional modules is any one or more of: a temperature sensor module, a light source module, a sound level sensor module, a pressure sensor module, a humidity sensor module, an air flow sensor module, an audio microphone sensor module, a light sensor module, a piezo device module, a accelerometer module, a particle sensor module, a gas sensor module, a pump circuitry module, a fan speed module, a camera module, and a wireless transceiver module.

4. The modular PC cooling pump of claim 1, wherein the one or more pump modules is any one or more of: an impeller with motor type module, a cold plate type module.

5. The modular PC cooling pump of claim 1, wherein the one or more cover modules is symmetrical.

6. The modular PC cooling pump of claim 1, wherein the one or more cover modules is asymmetrical.

7. The modular PC cooling pump of claim 1, wherein two or more pump modules are stacked to satisfy a predetermined flow requirement of liquid flowing through the stacked pump modules.

8. The modular PC cooling pump of claim 1, wherein two or more cover modules are stacked to form part of the modular PC cooling pump.

9. The modular PC cooling pump of claim 1, wherein two or more functional modules are stacked to form part of the modular PC cooling pump.

* * * * *